United States Patent
Tsukamoto

[11] Patent Number: 6,124,187
[45] Date of Patent: Sep. 26, 2000

[54] METHOD OF FABRICATING SEMICONDUCTOR DEVICE

[75] Inventor: Masanori Tsukamoto, Kanagawa, Japan

[73] Assignee: Sony Corporation, Tokyo, Japan

[21] Appl. No.: 08/777,814

[22] Filed: Dec. 31, 1996

[30]    Foreign Application Priority Data

Jan. 12, 1996  [JP]  Japan .................. P08-003781

[51] Int. Cl.$^7$ .................................................. H01L 21/425
[52] U.S. Cl. .................. 438/530; 438/301; 438/306; 438/530; 438/279
[58] Field of Search .................. 438/228, 297, 438/565, 795, 299, 301, 303, 305, 306, 307, 522, 519, 521, 527, 529, 530

[56]           References Cited

U.S. PATENT DOCUMENTS

| | | | |
|---|---|---|---|
| 4,544,418 | 10/1985 | Gibbons ........................... | 438/565 |
| 4,555,842 | 12/1985 | Levinstein et al. ............... | 438/585 |
| 4,585,492 | 4/1986 | Weinberg et al. ................ | 438/795 |
| 4,749,441 | 6/1988 | Christenson et al. ............ | 156/44 |
| 5,254,484 | 10/1993 | Hefner et al. .................... | 438/515 |
| 5,306,657 | 4/1994 | Yang ................................ | 438/278 |
| 5,384,285 | 1/1995 | Sitaram et al. .................. | 438/664 |
| 5,424,572 | 6/1995 | Solheim ........................... | 257/370 |
| 5,489,540 | 2/1996 | Liu et al. ......................... | 438/228 |
| 5,691,212 | 11/1997 | Tsai et al. ........................ | 438/297 |

FOREIGN PATENT DOCUMENTS 0 450 500 A2  3/1991  European Pat. Off. .

*Primary Examiner*—Wael Fahmy
*Assistant Examiner*—Khanh Duong
*Attorney, Agent, or Firm*—Ronald P. Kananen; Rader, Fishman & Grauer

[57]           ABSTRACT

In a method of fabricating a semiconductor device having an N$^+$-type layer or P$^+$-type layer containing an impurity in a concentration of $1\times10^{19}/cm^3$ or more, or a semiconductor device having a silicon based gate electrode structure containing an impurity, the final one of heat treatments each exerting an effect to an active state of the impurity is a high rapid thermal anneal, to thereby suppress an increase in resistance of the N$^+$-type layer or P$^+$-type layer as a diffusion layer or improve depletion of a poly-Si based gate electrode without occurrence of variations in threshold voltage.

14 Claims, 8 Drawing Sheets

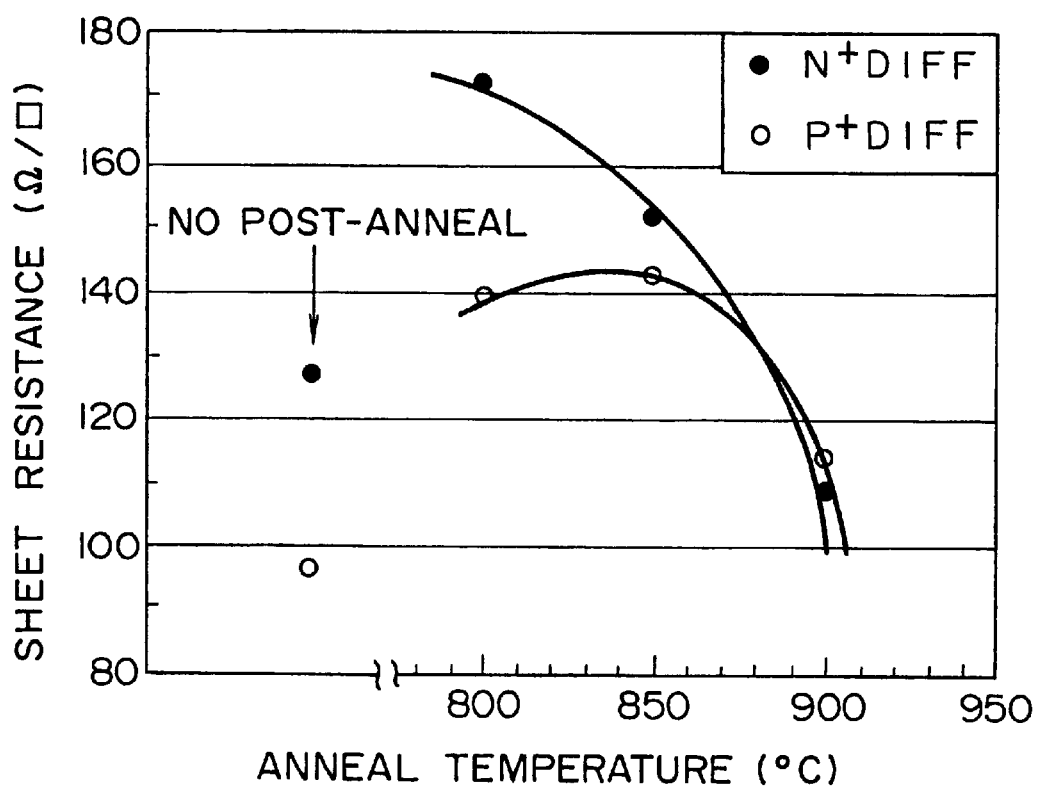
F I G. 1

METHOD OF FABRICATING SEMICONDUCTOR DEVICE

BACKGROUND OF THE INVENTION

The present invention relates to a method of fabricating a semiconductor device having an $N^+$-type layer or $P^+$-type layer containing an impurity in a concentration of $1 \times 10^{19}/cm^3$ or more, or a semiconductor device having a silicon based gate electrode structure containing an impurity.

In fabrication of various semiconductor circuits such as MOS circuits and bipolar circuits, heat treatments at 700° C. or more are performed in many processing steps for the purpose of activation of impurities in diffusion layers and polysilicon based gate electrodes, densification of insulating films, and the like. For example, in a MOS structure, a polysilicon (hereinafter, referred to as poly-Si) or a polycide having a stacked structure of poly-Si and metal silicide is often used as a gate electrode for ensuring reliability of a gate oxide film in a high temperature process, and in a fabrication process of such a MOS structure, a heat treatment at 700° C. or more is usually performed for activation or the like of an impurity in a poly-Si.

One of these heat treatments performed at 700° C. or more is a high temperature/short-time anneal, that is, a rapid thermal anneal (hereinafter, referred to as RTA) for effectively activating an impurity while suppressing diffusion of the impurity. In recent years, the RTA is being variously carried out as a technique essential for fabrication of semiconductor devices.

Incidentally, in fabrication of a semiconductor device, heat treatments at temperatures of from 600 to 850° C., such as high temperature/long-time anneal for densifying an insulating film and high temperature CVD, are usually performed after the above-described RTA.

The long-time heat treatment performed after the RTA, however, is disadvantageous in that the impurity once activated by the RTA is inactivated again, tending to increase resistances of Si constituting a diffusion layer and poly-Si constituting a gate electrode or to deplete a gate electrode, resulting in the degraded device characteristics. This leads to reduction in performances of the semiconductor device.

FIG. 1 is a graph showing variations in sheet resistance of an $N^+$-type diffusion layer and a $P^+$-type diffusion layer of a semiconductor device subjected to post-anneal for 30 minutes after RTA (1000° C.×10 seconds). In addition, the ion implantation of the $N^+$-type diffusion layer and the $P^+$-type diffusion layer is performed such that ions of As ($As^+$) are implanted into the $N^+$-type diffusion layer in a dose of $3 \times 10^{15}/cm^2$ and ions of $BF_2$ ($BF_2^+$) are implanted into the $P^+$-type diffusion layer in a dose of $4 \times 10^{15}/cm^2$.

As seen from FIG. 1, the sheet resistance of the semiconductor device is significantly increased in the case where the semiconductor device is subjected to the high temperature/long-time anneal (post-anneal) at a temperature of from 800 to 850° C., as compared with the case where the semiconductor device is not subjected to the post-anneal, that is, it is subjected only to RTA.

The same is true for a silicon based gate electrode. For example, a high temperature/long-time anneal performed at a temperature of from 800 to 850° C. for 30 minutes after RTA tends to cause depletion of poly-Si and hence to reduce a gate capacity.

To cope with such an inconvenience, an attempt may be made to set higher a temperature of high temperature/long-time anneal for lowering the resistances of a diffusion layer and a gate electrode and for improving depletion of the gate electrode. In this attempt, however, a depth (Xj) of the diffusion layer is increased, failing to suppress a short channel effect, and further in the case where an $N^+$-type gate of a NMOS is connected to a $P^+$-type gate of a PMOS in a CMOS structure, there arises a disadvantage in causing mutual diffusion of impurities in the gate electrodes, tending to vary (increase) a threshold voltage (Vth).

OBJECT AND SUMMARY OF THE INVENTION

An object of the present invention is to provide a method of fabricating a semiconductor device, which is capable of suppressing an increase in resistance of an $N^+$-type layer or $P^+$-type layer as a diffusion layer without occurrence of variations in voltage.

Another object of the present invention is to provide a method of fabricating a semiconductor device, which is capable of improving depletion of a poly-Si based gate electrode.

To achieve the above object, according to a first aspect of the present invention, there is provided a method of fabricating a semiconductor device having an $N^+$-type layer or $P^+$-type layer containing an impurity in a concentration of $1 \times 10^{19}/cm^3$ or more, including the steps of: forming an $N^+$-type layer or $P^+$-type layer containing an impurity in a concentration of $1 \times 10^{19}/cm^3$ or more; and subjecting said $N^+$-type layer or $P^+$-type layer to heat treatments, each of said heat treatments exerting an effect on an active state of said impurity; wherein the final one of said heat treatments is a rapid thermal anneal.

Concretely, the above heat treatments each exerting an effect on the active state of the impurity, are performed at temperatures of 700° C. or more. Namely, a heat treatment at a temperature of less than 700° C. little exerts an effect on the active or inactive state of the impurity, and accordingly, even if such a heat treatment is performed before the final rapid thermal anneal, the impurity is little inactivated again.

The rapid thermal anneal is preferably performed at a temperature of from 800 to 1100° C. for a time of 60 seconds or less. When the temperature is less than 800° C., the effect exerting on the active state of the impurity is insufficient; while when it is more than 1100° C., diffusion of the impurity becomes excessively larger, losing the effect of the rapid thermal anneal. Also, the reason why the processing time is set at a value of 60 seconds or less is as follows. When it is more than 60 seconds, the impurity is possibly diffused to such an extent as to be extended out of the desired range. In addition, the lower limit of the processing time, which is due to the processing temperature, is set at a value enough to activate the impurity, concretely, about 10 seconds.

According to the above-described method of fabricating a semiconductor device, since the final heat treatment is a rapid thermal anneal, there is no heat treatment exerting an effect on the active state of the impurity after the final rapid thermal anneal and consequently the impurity activated by the rapid thermal anneal is not inactivated again, to thus suppress an increase in resistance of the $N^+$-type layer or $P^+$-type layer.

According to a second aspect of the present invention, there is provided a method of fabricating a semiconductor device having a silicon based gate electrode structure containing an impurity, including the steps of: forming a silicon based gate electrode containing an impurity; and subjecting said silicon based gate electrode to heat treatments, each of said heat treatments exerting an effect to an active state of said impurity; wherein the final one of said heat treatments is a rapid thermal anneal.

The rapid thermal anneal is preferably performed at a temperature of from 800 to 1100° C. for a time of 60 seconds or less for the same reason as described above. Samples of the silicon based gate electrode structures include a polycide structure having a stacked structure of poly-Si and a metal silicide, a stacked structure of poly-Si and a metal, a stacked structure of poly-Si and a metal compound such as TiN, and a structure of poly-Si or a-Si. Such a silicon based gate electrode structure is preferably doped with an impurity by ion implantation because the impurity doped in the silicon based gate electrode structure by ion implantation is positively activated by the final rapid thermal anneal.

The semiconductor device may include a duel gate type having an NMOS field effect transistor having an $N^+$-type gate electrode and a PMOS field effect transistor having a $P^+$-type gate electrode. In this case, activation of the impurity and improvement in depletion of the $N^+$-type gate electrode and the $P^+$-type gate electrode can be simultaneously performed by the final rapid thermal anneal.

According to the above-described method of fabricating a semiconductor device, since the final heat treatment is a rapid thermal anneal, there is no heat treatment exerting an effect on the active state of the impurity, and consequently the impurity activated by the high rapid thermal anneal is not inactivated again, and further depletion of the gate electrode is improved, to thus suppress deterioration of performances of the semiconductor device.

According to a third aspect of the present invention, there is provided a method of fabricating a semiconductor device having an $N^+$-type layer or $P^+$-type layer containing an impurity in a concentration of $1 \times 10^{19}/cm^3$ or more, including the steps of: forming an $N^+$-type layer or $P^+$-type layer containing an impurity in a concentration of $1 \times 10^{19}/cm^3$ or more; subjecting said an $N^+$-type layer or $P^+$-type layer to heat treatments, each of said heat treatments exerting an effect to an active state of said impurity; wherein said heat treatments include a first high rapid thermal anneal performed after formation of said $N^+$-type layer or $P^+$-type layer, a high temperature/long-time anneal performed after said first rapid thermal anneal; and a final rapid thermal anneal.

Concretely, the heat treatments are performed at temperatures of 700° C. or more for the same reason as described above. The final rapid thermal anneal is preferably performed at a temperature of from 800 to 1100° C. for a time of 60 seconds or less for the same reason as described above.

The high temperature/long-time anneal is preferably performed at a temperature of from 600 to 950° C. for a time of 10 minutes or more for the same reason as described above. Namely, the heat treatment at a temperature less than 600° C. for a long time little exerts an effect on the active state of the impurity, and the heat treatment at a temperature of 950° C. or more for a time of 10 minutes or more causes mutual diffusion of impurities, to degrade device characteristics.

According to the above-described method of the fabricating a semiconductor device, since the final rapid thermal anneal is performed after the first rapid thermal anneal and the high temperature/long-time anneal, even when the impurity activated by the first rapid thermal anneal is inactivated once by the high temperature/long-time anneal, it is activated again by the final rapid thermal anneal, and further there is no heat treatment exerting an effect on the active state of the impurity after the final rapid thermal anneal, so that the impurity activated by the final rapid thermal anneal is not inactivated again, to thus suppress an increase in resistance of the $N^+$-type layer or $P^+$-type layer.

According to a fourth aspect of the present invention, there is provided a method of fabricating a semiconductor device having a silicon based gate electrode structure containing an impurity, including the steps of: forming a silicon based gate electrode containing an impurity; and subjecting said an $N^+$-type layer or $P^+$-type layer to heat treatments, each of said heat treatments exerting an effect to an active state of said impurity; wherein said heat treatments include a first rapid thermal anneal performed after formation of said $N^+$-type layer or $P^+$-type layer, a high temperature/long-time anneal performed after said first rapid thermal anneal; and a final rapid thermal anneal.

The final rapid thermal anneal is preferably performed at a temperature of from 800 to 1100° C. for a time of 60 seconds or less for the same reason as described above. The high temperature/long-time anneal is preferably performed at a temperature of from 600 to 950° C. for a time of 10 minutes or more for the same reason as described above.

The silicon based gate electrode structure may be of the same type as described above, for example, a polycide type; and the semiconductor device may be the same type as described above, for example, a dual gate type.

According to the above-described method of fabricating a semiconductor device, since the final rapid thermal anneal is performed after the first rapid thermal anneal and the high temperature/long-time anneal, even when the gate electrode is depleted once by the high temperature/long-time anneal, the impurity in the silicon based gate electrode is activated again by the final rapid thermal anneal, and further there is no heat treatment exerting an effect on the active state of the impurity after the final rapid thermal anneal, so that depletion of the gate electrode is improved, to thus suppress deterioration of performances of the semiconductor device.

BRIEF DESCRIPTION OF THE DRAWINGS

Other features and advantages of the invention will be apparent from the following description taken in connection with the accompanying drawings, wherein:

FIG. 1 is a graph showing variations in sheet resistance of an $N^+$-type diffusion layer and a $P^+$-type diffusion layer which are subjected to post-anneal after RTA;

DETAILED DESCRIPTION OF THE PREFERRED EMBODIMENTS

Hereinafter, preferred embodiments of the present invention will be described in detail with reference to the drawings.

FIGS. 2(a) to 2(f) are views illustrating a first embodiment of the present invention, in which the present invention is applied to a process of fabricating a single gate type CMOS circuit.

Figure 2A:
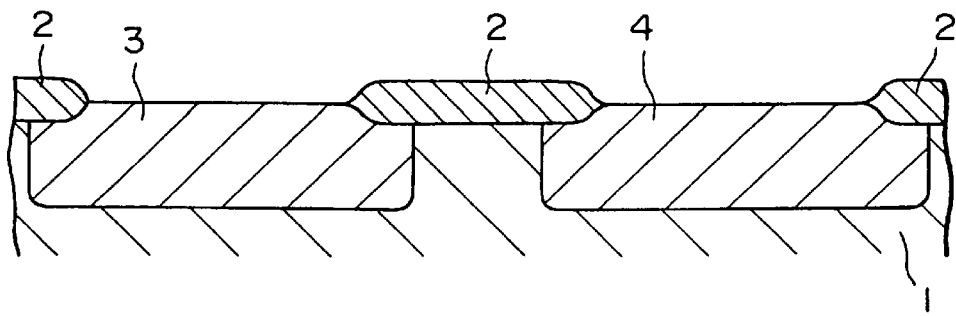
FIGS. 2(a) to 2(f) are sectional side views of an essential portion of a wafer illustrating processing steps of a first embodiment of the present invention.

As shown in FIG. 2(a), a field oxide film 2 is formed on a Si substrate 1 by LOCOS (local oxidation of silicon), for example, wet oxidation at 950° C. A region of the Si substrate 1, in which an NMOSFET is to be formed, is subjected to ion implantation in order to form a P-well region, to form an embedded layer for preventing punch-through of a transistor, and to adjust a Vth (threshold voltage). An NMOS channel region 3 is thus formed in a surface layer portion of the Si substrate 1. Likewise, a region of the Si substrate 1, in which a PMOSFET is to be formed, is subjected to ion implantation in order to form an N-well region, to form an embedded layer for preventing punch-through of a transistor, and to adjust the Vth. A PMOS channel region 4 is thus formed in the surface layer portion of the Si substrate 1.

Figure 2B:
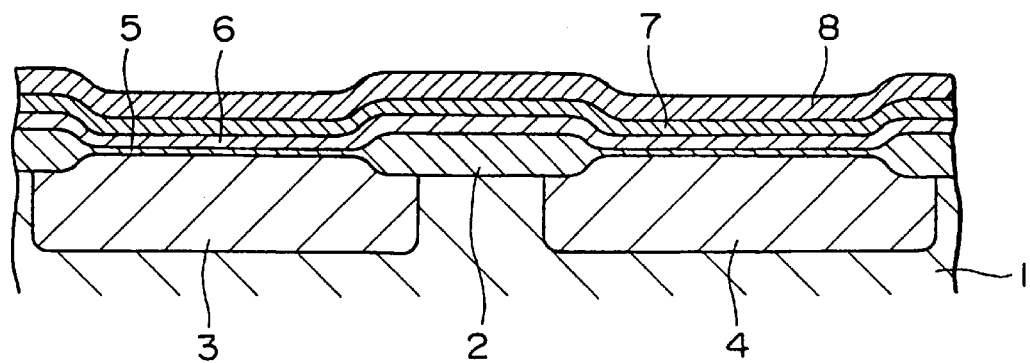

As shown in FIG. 2(b), a gate oxide film 5 having a thickness of 8 nm is formed on the surface of the Si substrate 1 by thermal oxidation, for example, heating at 850° C. in a $H_2/O_2$ atmosphere. An a-Si film 6 having a thickness of 100 nm is then formed on the gate oxide film 5 by low pressure CVD. In this low pressure CVD, a-Si doped with phosphorous (P) is deposited at 550° C. using a source gas of, for example, $SiH_4/PH_3$. Subsequently, a $WSi_x$ film 7 having a thickness of 100 nm is formed on the a-Si film 6 by low pressure CVD. In this low pressure CVD, WSix is deposited at 380° C. using a source gas of, for example, $WF_6/SiH_4$. An offset oxide film 8, made from $SiO_2$, having a thickness of 150 nm is further formed on the $WSi_x$ film 7 by CVD. In this CVD, $SiO_2$ is deposited at 420° C. using a source gas of, for example, $SiH_4/O_2$. Thus, a tungsten polycide interconnection layer with an offset oxide film is obtained.

Figure 2C:
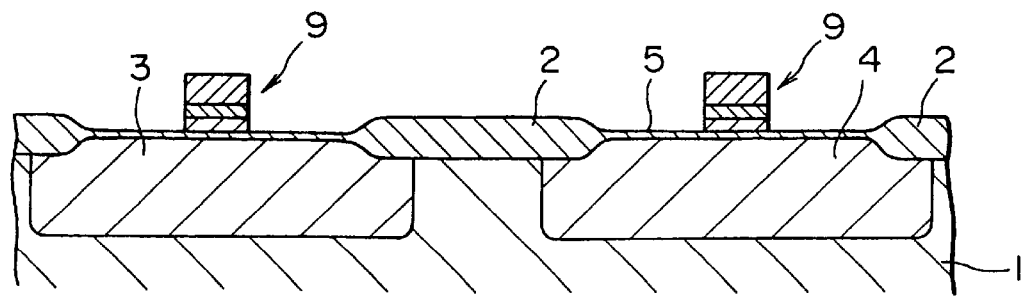

A resist is then patterned over the entire surface of the offset oxide film 8 by the known lithography process, and the offset film 8 made from $SiO_2$ is anisotropically etched with a fluorocarbon based gas or the like into a gate electrode pattern using the resist pattern thus obtained (not shown) as a mask. The resist pattern is removed, and both the $WSi_x$ film 7 and the a-Si film 6 are anisotropically etched with a $Cl_2/O_2$ gas or the like using the gate electrode pattern thus obtained as a mask, to form a gate electrode pattern 9 as shown in FIG. 2(c). The gate electrode pattern 9 thus obtained, which is a gate electrode pattern including the a-Si film 6, is equivalent to the silicon based gate electrode structure to which the present invention is applicable.

Figure 2D:
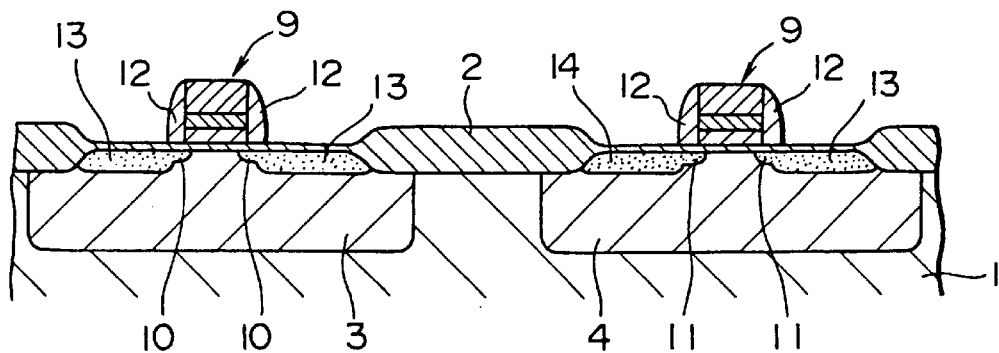

Ions of, for example, As are implanted into the NMOS channel region 3 in a condition (energy: 20 keV, dose: $5\times10^{13}/cm^2$) using the gate electrode pattern 9 and the field oxide film 2 as a mask, to form an NLDD region 10; while ions of, for example, $BF_2$ are implanted into the PMOS channel region 4 in a condition (energy: 20 keV, dose: $2\times10^{13}/cm^2$) using the gate electrode pattern 9 and the field oxide film 2 as a mask, to form a PLDD region 11. A $SiO_2$ film having a thickness of 150 nm is formed on the Si substrate 1 by depositing $SiO_2$ through, for example, low pressure CVD, followed by anisotropic etching, to form a side wall 12 on both sides of the gate electrode pattern 9 as shown in FIG. 2(d).

Ions of, for example, As are then implanted into the NMOS channel region 3 in a condition (energy: 20 keV, dose: $3\times10^{15}/cm^2$), to form an $N^+$-type source/drain region 13. Likewise, ions of, for example, $BF_2$ are implanted into the PMOS channel region 4 in a condition (energy: 20 keV, dose: $3\times10^{15}/cm^2$), to form a $P^+$-type source/drain region 14. It is to be noted that the $N^+$-type source/drain region 13 and the $P^+$-type source/drain region 14 are shown to be deeper than the NLDD region 10 and the PLDD region 11 respectively; however, in this step, they are not diffused so deeper as to be shown in FIG. 2(d) because any diffusion treatment for the implanted impurities thereof is not actually performed yet. In other words, with respect to the $N^+$-type source/drain region 13 and the $P^+$-type source/drain region 14, the states thereof obtained after diffusion treatment described later are shown in FIG. 2(d) for an easy understanding.

Figure 2E:
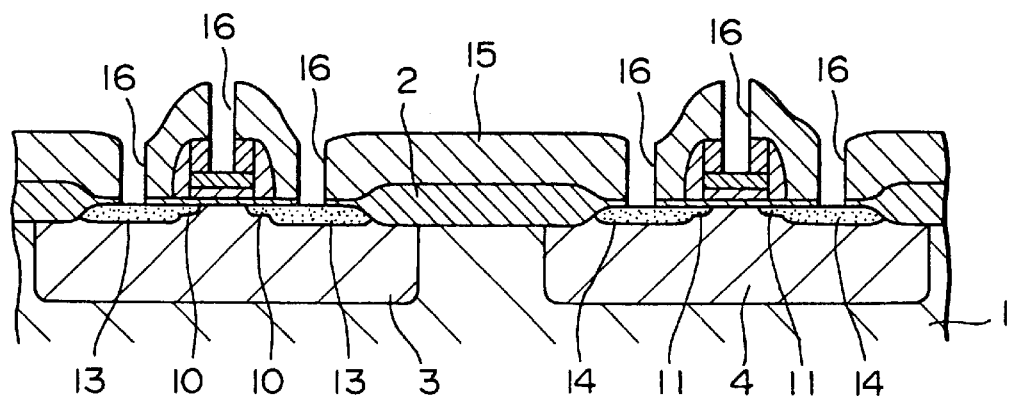

As shown in FIG. 2(e), an interlayer insulating film 15 having a thickness of 500 nm is formed by CVD. In this CVD, $SiO_2$ or PSG is deposited at 420° C. using a source gas of, for example, $SiH_4/O_2$. Subsequently, a resist is patterned over the entire surface of the interlayer insulating film 15 by the known lithography process, and the interlayer insulating film 15 is anisotropically etched with a fluorocarbon based gas or the like using the resist pattern thus obtained (not shown) as a mask, to form contact holes 16, 16 reaching the source/drain regions 13, 14.

Ions of, for example, P (phosphorus) are implanted into the $N^+$-type source/drain region 13 by way of the contact hole 16 in a dose of about $5\times10^{15}/cm^2$, while ions of, for example, $BF_2$ are implanted into the $P^+$-type source/drain region 14 in a dose of about $5\times10^{15}/cm^2$. Such an ion implantation, which is called "contact implantation", is adapted to suppress occurrence of junction leakage due to damages of the field oxide film and the Si substrate 1 by etching performed for formation of the contact hole 16.

Subsequently, as the heat treatment exerting an effect on the active state of the impurities previously doped by ion implantation, a rapid thermal anneal (RTA) in a condition of 1000° C.×10 seconds is performed, to activate the impurities, thus forming a CMOS structure. The RTA is equivalent to the final one of the heat treatments each exerting an effect on the active state of the impurities according to the present invention. With this RTA, the impurities doped in the source/drain regions 13, 14 by ion implantation are, as described above, diffused and activated as shown in FIG. 2(d), and also the impurities doped by ion implantation through the contact holes 16 are diffused and activated, to form impurity diffusion layers 17, 18 as shown in FIG. 2(f).

Figure 2F:
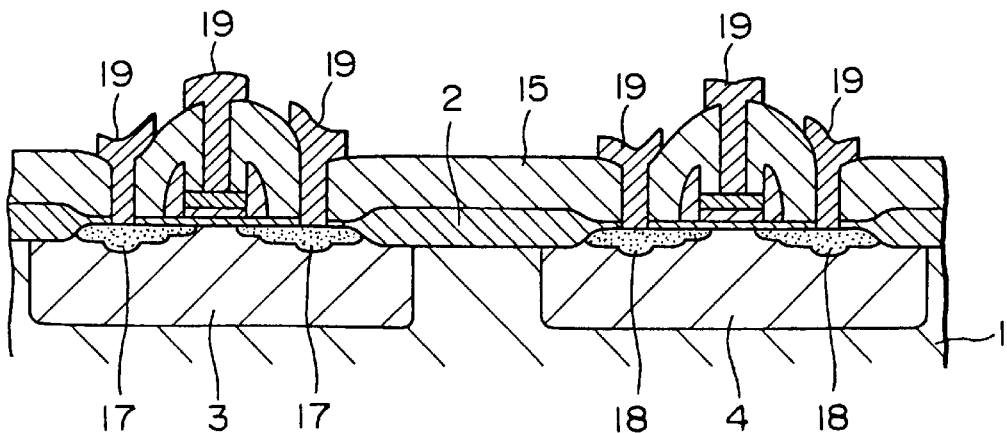

After that, an interconnection material such Al is deposited, followed by patterning, to form an interconnection pattern 19 connected to the gate and the source/drain as shown in FIG. 2(f), thus forming a CMOS circuit. In addition, formation of the interconnection pattern 19 does not involve any heat treatment exerting an effect on the active state of the impurities, that is, any heat treatment performed at 700° C. or more, and of course, for preventing melting of the pattern 19, there is not any heat treatment at 700° C. or more after formation of the pattern 19.

According to the fabricating method of this embodiment, as described above, formation of an interconnection layer made from Al or the like (does not involve any heat treatment at 700° C. or more) follows on activation of the impurities by the RTA performed at 1000° C. for 10 seconds after ion implantation through the contact hole, and consequently, the impurities activated in the activation step are not inactivated again, thereby making it possible to suppress an increase in resistance of the N$^+$-type source/drain region 13 (N$^+$-type layer) or P$^+$-type source/drain layer 14 (P$^+$-type layer) and improve depletion of the gate electrode pattern 9, and hence to form a high performance CMOS circuit.

FIGS. 3(a) to 3(f) are views illustrating a second embodiment of the present invention, in which the present invention is applied to a method of fabricating a duel gate (N$^+$/P$^+$) type CMOS circuit.

Like the first embodiment, a field oxide film 2 is formed on a Si substrate 1; an NMOS channel region 3 and a PMOS channel region 4 are formed in a surface layer portion of the Si substrate 1; and a gate oxide film 5 is formed on the surface of the Si substrate 1.

Figure 3A:
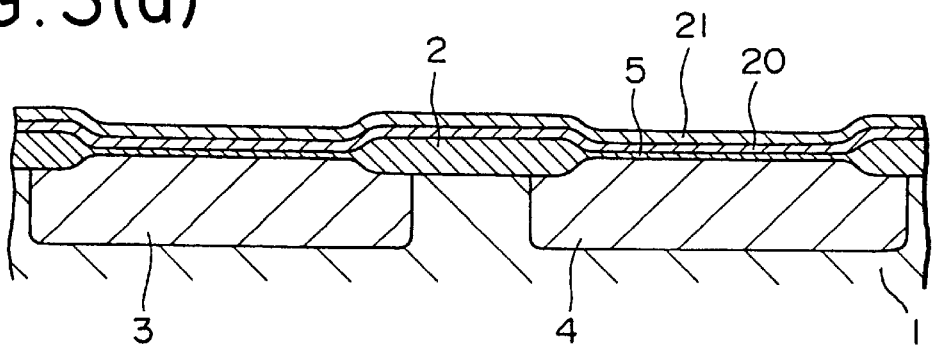
FIGS. 3(a) to 3(f) are sectional side views of an essential portion of a wafer illustrating processing steps of a second embodiment of the present invention.

As shown in FIG. 3(a), a poly-Si film 20 having a thickness of 70 nm is formed on the gate oxide film 5 by low pressure CVD. In this low pressure CVD, poly-Si is deposited at 610° C. using a source gas of, for example, SiH$_4$. Subsequently, an a-Si film 21 having a thickness of 50 nm is formed on the poly-Si film 20 by low pressure CVD. In this low pressure CVD, a-Si is deposited at 550° C. using a source gas of, for example, SiH$_4$.

Figure 3B:
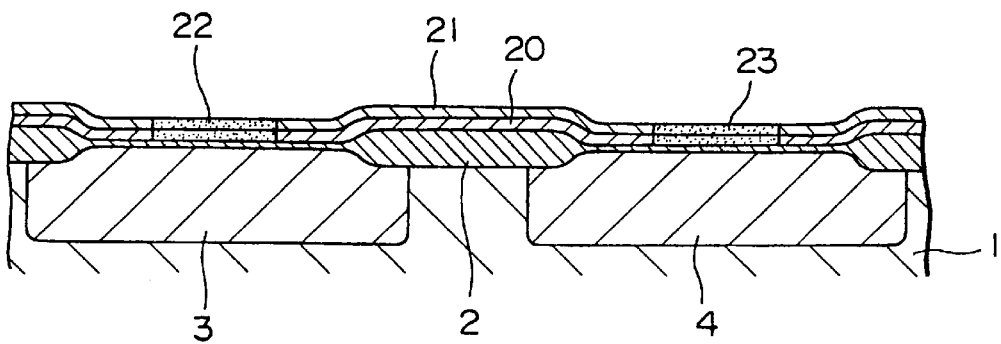
Figure 3C:
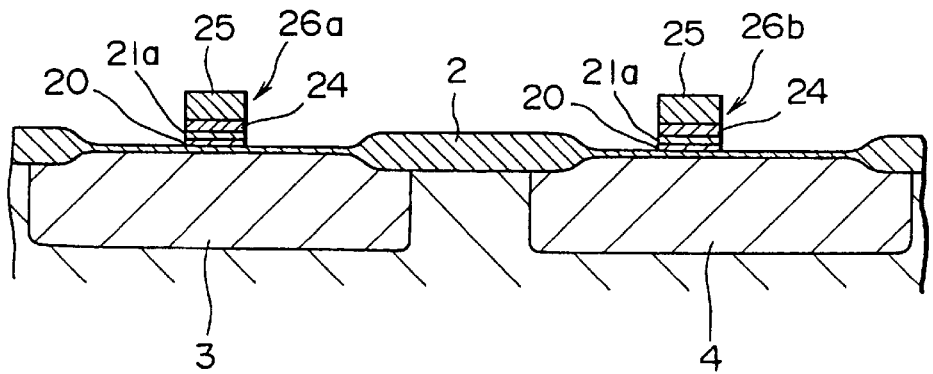
Figure 3D:
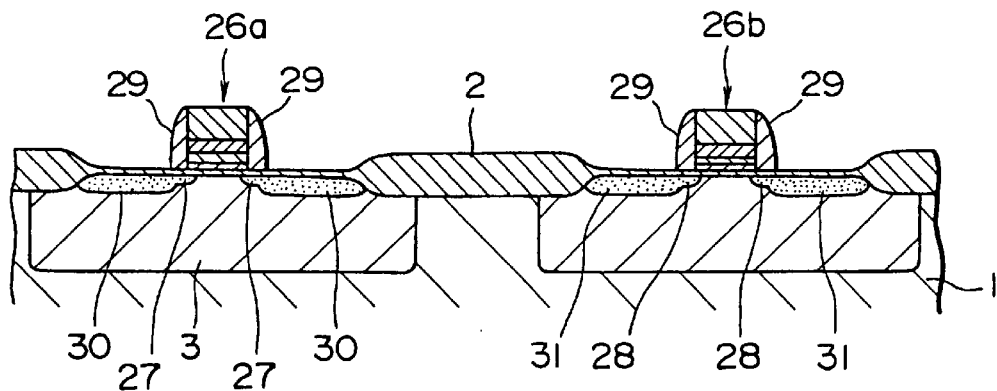

A resist is patterned by the known lithography process, and ions of P (phosphorus) are implanted only into a region where an NMOSFET is to be formed, that is, into the NMOS channel region 3 in a condition (energy: 10 keV, dose: $5\times10^{15}/cm^2$) using the resist pattern thus obtained (not shown) as a mask, to form an N$^+$-type gate region 22 (N$^+$-type layer) as shown in FIG. 3(b). Likewise, ions of B are implanted only into a region where a PMOSFET is to be formed, that is, into the PMOS channel region 4 in a condition (energy: 5 keV, dose: $5\times10^{15}/cm^2$ using the resist pattern thus obtained (not shown) as a mask, to form a P$^+$-type gate region 23 (P$^+$-type layer).

Next, a heat treatment at 650° C. for 10 hours is performed as a lower temperature/long-time anneal for crystallizing the a-Si film 21. The a-Si film 21 is crystallized by the lower temperature/long-time anneal, to form a poly-Si film 21a having a crystal size larger than that of the poly-Si film 20 formed by CVD. Subsequently, a RTA in a condition of 1000° C.×10 seconds is performed, to diffuse the impurity on the surface portion of the poly-Si film 21a in the interior of the poly-Si film 21a and to activate the impurities doped in the poly-Si film 21a and the poly-Si film 20 by ion implantation. Namely, the RTA is equivalent to the first rapid thermal anneal as the heat treatment exerting an effect on the active state of the impurities according to the present invention.

A WSix film 24 having a thickness of 70 nm is formed on the poly-Si film 21a by low pressure CVD. In this low pressure CVD, WSix is deposited at 380° C. using a source gas of, for example, WF$_6$/SiH$_4$. An offset oxide film 25 having a thickness of 150 nm is formed on the WSix film 24 by CVD. In this CVD, SiO$_2$ is deposited at 420° C. using a source gas of, for example, SiH$_4$/O$_2$. A tungsten polycide interconnection layer with an offset oxide film is thus obtained, like the first embodiment.

Next, a resist is patterned by the known lithography process, and the offset oxide film 25 made from SiO$_2$ is anisotropically etched with a fluorocarbon gas or the like into a gate electrode pattern using the resist pattern thus obtained (not shown) as a mask. The resist pattern is removed, and the WSix film 24, the poly-Si film 21a and the poly-Si film 20 are anisotropically etched with a Cl$_2$/O$_2$ gas or the like into a gate electrode pattern using the gate electrode pattern thus obtained as a mask, to form an N$^+$-type gate electrode 26a on the side where the N$^+$-type gate region 22 is formed and a P$^+$-type gate electrode 26b on the side where the P$^+$-type gate region 23 is formed. In addition, each of the gate electrodes 26a, 26b having a gate electrode pattern including the poly-Si film 21a and the poly-Si film 20 is equivalent to the silicon based gate electrode structure to which the present invention is applicable.

Ions of, for example, As are then implanted into the NMOS channel region 3 in a condition (energy: 20 keV, dose: $5\times10^{13}/cm^2$) using the gate electrode 26a and the field oxide film 2 as a mask, to form an NLDD region 27; while ions of, for example, BF$_2$ are implanted into the PMOS channel region 4 in a condition (energy: 20 KeV, dose: $5\times10^{13}/cm^2$) using the gate electrodes 26b and the field oxide film 2 as a mask, to form a PLDD region 28. Then, SiO$_2$ is deposited on the Si substrate 1 to a thickness of 150 nm by low pressure CVD or the like, and the SiO$_2$ film thus obtained is anisotropically etched, to form a side wall 29 on both the sides of each of the gate electrodes 26a, 26b as shown in FIG. 3(e).

Ions of, for example, As are implanted into the NMOS channel region 3 in a condition (energy: 20 keV, dose: $3\times10^{15}/cm^2$), to form an N$^+$-type source/drain region 30 (N$^+$-type layer); while ions of, for example, BF$_2$ are implanted into the PMOS channel region 4 in a condition (energy: 20 keV, dose: $3\times10^{15}/cm^2$), to form a P$^+$-type source/drain region 31 (P$^+$-type layer). Subsequently, a rapid thermal anneal (RTA) is performed in a condition of 1000° C.×10 seconds, to diffuse and activate the impurities doped in the source/drain regions 30, 31, thus forming a CMOS structure. The RTA, which is the heat treatment exerting an effect on the active state of the impurities, is referred to as a second RTA for distinguishing it from the first RTA previously described.

Figure 3E:
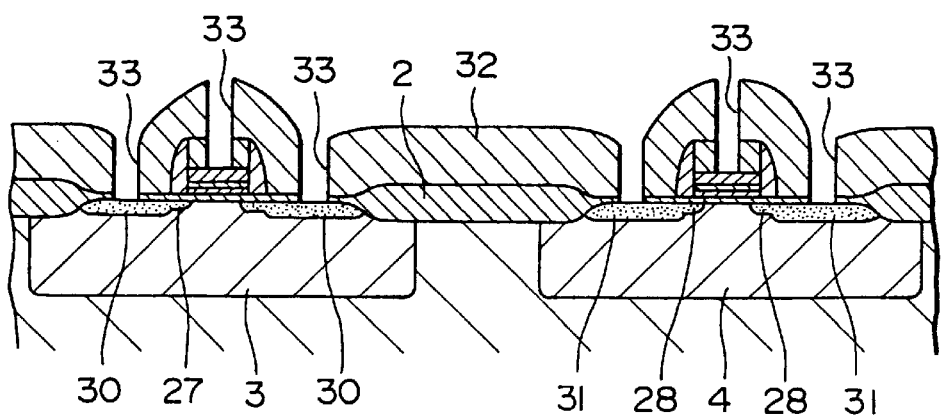

An interlayer insulating film 32 having a thickness of 500 nm is then formed as shown in FIG. 3(e) by CVD. In this CVD, SiO$_2$ or PSG is deposited at 420° C. using a source gas of, for example, SiH$_4$/O$_2$. Subsequently, a high temperature/long-time anneal is performed in a condition of 800° C.×30 minutes for densifying the interlayer insulating film 32. With this high temperature/long-time anneal, the interlayer insulating film 32 is densified; however, the impurities in the N$^+$-type gate electrode (N$^+$-type layer) 26a, the P$^+$-type gate electrode (P$^+$-type layer) 26b, the N$^+$-type source/drain region (N$^+$-type layer) 30, and the P$^+$-type source/drain region (P$^+$-type layer) 31, which are previously activated, are inactivated again, to thereby deplete the gate electrodes 26a, 26b, and to increase the resistances of the source/drain regions 30, 31. In addition, the high temperature/long-time anneal is equivalent to the high temperature/long-time anneal performed after the first RTA according to the present invention.

A resist is patterned over the entire surface of the interlayer insulating film 32 by the known lithography process, and the interlayer insulating film 32 is anisotropically etched with a fluorocarbon based gas or the like using the resist pattern thus obtained as a mask, to form contact holes 33, 33 reaching the source/drain regions 30, 31.

Next, ions of, for example, P (phosphorus) are implanted into the N$^+$-type source/drain region 30 in a dose of about $5\times10^{15}/cm^2$ through the contact hole 33; while ions of, for example, $BF_2$ are implanted into the $P^+$-type source/drain region 31 in a dose of about $5\times10^{15}/cm^2$ through the contact hole 33. This ion implantation is performed for suppressing junction leakage and the like, just as in the first embodiment.

Subsequently, as a heat treatment exerting an effect on the active state of the impurities previously doped by ion implantation, a rapid thermal anneal (RTA) in a condition of 950° C.×10 seconds is performed, to active the impurities, thus forming a CMOS structure. The RTA is equivalent to the final one of the heat treatments each exerting an effect on the active state of the impurities according to the present invention. With this final RTA, the impurities inactivated by the high temperature/long-time anneal are activated again, and also the impurities doped by ion implantation through the contact holes 33, 33 are diffused and activated. In addition, each of the $N^+$-type source/drain region 30 and the $P^+$-type source/drain region 31 contains the impurities in a concentration of $1\times10^{20}/cm^3$ or more.

Figure 3F:
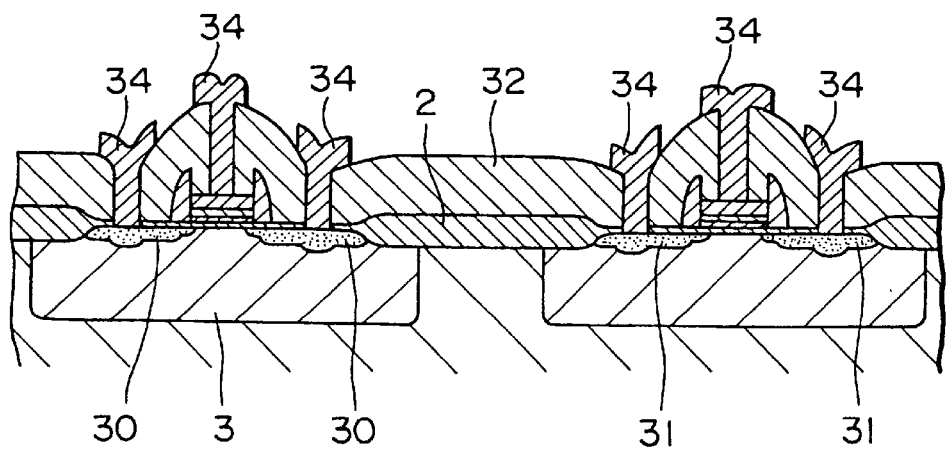

After that, an interconnection material such as Al is deposited, followed by patterning, to form an interconnection pattern 34 connected to the gate and the source/drain as shown in FIG. 3(f), thus forming a CMOS circuit. In addition, formation of the interconnection pattern 34 does not involve any heat treatment exerting an effect on the active state of the impurities, that is, any heat treatment performed at 700° C. or more, and of course, for preventing melting of the pattern 19, there is not any heat treatment at 700° C. or more after formation of the pattern 19.

According to the method of the present invention of this embodiment, as described above, the rapid thermal anneals and the high temperature/long-time anneals are several times repeated as the heat treatments each exerting an effect on the active state of the impurities; however, the final one of these heat treatments is taken as the rapid thermal anneal (RTA), and consequently the impurities activated by such a final RTA are not inactivated again, thereby making it possible to suppress an increase in resistances of the $N^+$-type source/drain layer ($N^+$-type layer) 30 and the $P^+$-type source/drain layer ($P^+$-type layer) 31 and improve the depletion of the $N^+$-type gate electrode ($N^+$-type layer) 26a and the $P^+$-type gate electrode ($P^+$-type layer) 26b, and hence to form the high performance CMOS circuit.

(Experimental example)

Ions of P (phosphorus) are implanted into a poly-Si layer on a Si substrate in a dose of $3\times10^{15}/cm^2$, to form an $N^+$-type gate electrode. A MOS structure is thus obtained. The MOS structure is sequentially subjected to a first RTA in a condition of 1000° C.×10 seconds, a high temperature/long-time anneal in a condition of 800° C.×30 minutes, and the final RTA in a condition of 950° C.×10 seconds in this order. With respect to this sample, a C-V characteristic after each anneal is examined. The results are shown in FIG. 4.

Figure 4:
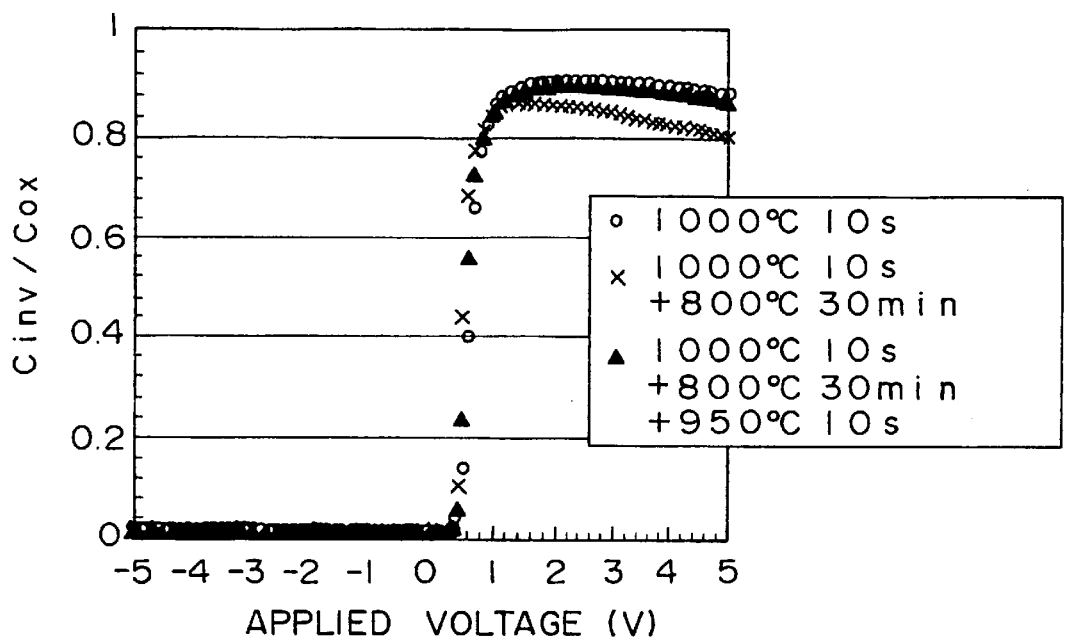
FIG. 4 is a graph showing a C-V characteristic of a MOS structure in a state after being subjected to anneal.

As seen from FIG. 4, the gate electrode of the sample in the state after the first RTA (1000° C.×10 seconds) is depleted and is reduced in its capacity when the sample is subjected to the high temperature/long-time anneal (800° C.×30 minutes) after the first RTA (1000° C.×10 seconds); however, it is improved in its depletion and is recovered in its capacity when the sample is further subjected to the final RTA (950° C.×10 seconds).

Ions of As are implanted into a surface layer portion of a Si substrate in a condition (energy: 20 keV, dose: $3\times10^{15}/cm^2$), to form an $N^+$-type diffusion layer; while ions of $BF_2$ are implanted into the surface layer portion of a Si substrate in a condition (energy: 20 keV, dose: $3\times10^{15}/cm^2$), to form a $P^+$-type diffusion layer. The Si substrate are sequentially subjected to a first RTA (1000° C.×10 seconds), a high temperature/long-time anneal (800° C.×30 minutes), and the final RTA (950° C.×10 seconds) in this order. With this sample, a sheet resistance of each diffusion layer after each anneal is examined. The results are shown in FIG. 5.

Figure 5:
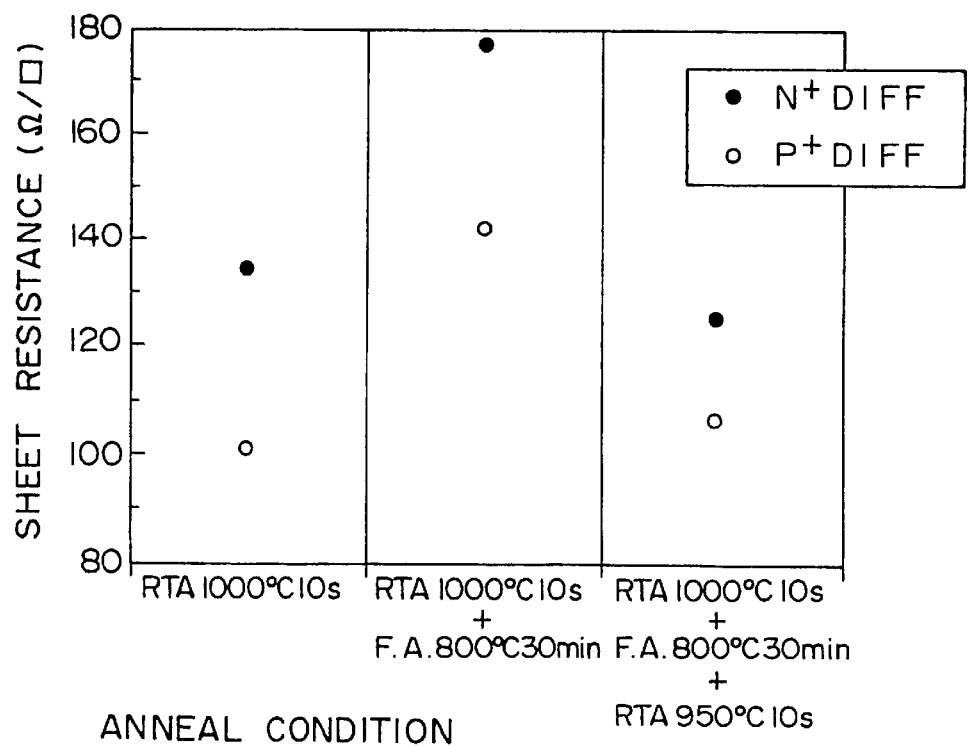
FIG. 5 is a graph showing a relationship between an anneal condition and a sheet resistance of a diffusion layer in a state after being subjected to anneal.

As seen from FIG. 5, the sheet resistance of each diffusion layer of the sample in the state after the first RTA is increased when the sample is subjected to the high temperature/long-time anneal (800° C.×30 minutes) after the first RTA (1000° C.×10 seconds) because the impurities in each diffusion layer are inactivated by the high temperature/long-time anneal (800° C.×30 minutes); however, the resistance of each diffusion layer is decreased closer to the original value when the sample is further subjected to the final RTA (950° C.×10 seconds) because the impurities are activated again by the final RTA. In addition, character FA in FIG. 5 indicates a high temperature/long-time anneal.

A third embodiment will be described below with respect to FIGS. 6 to 8.

Figure 6:
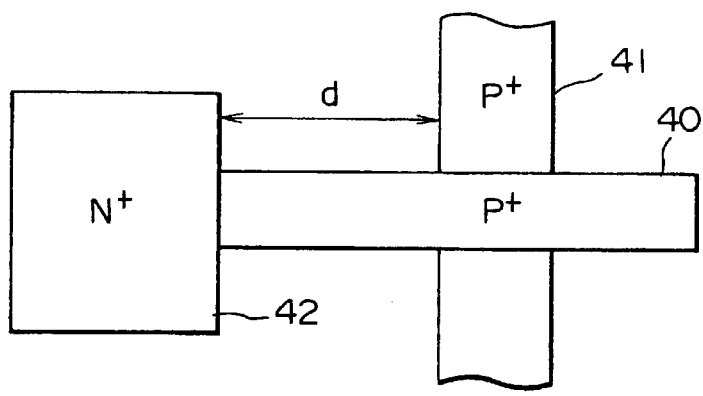
FIG. 6 is a plan view showing a schematic configuration of a PMOS structure as a third embodiment.

As shown in FIG. 6, a PMOS structure is formed on a silicon substrate. In this figure, reference numeral 40 indicates a $P^+$-type gate; 41 is a $P^+$-type diffusion layer; 42 is an $N^+$-type diffusion source (gate). In addition, a W/L of the PMOS structure is 1 $\mu$m/1 $\mu$m. Moreover, assuming that a distance between the $P^+$-type diffusion layer 41 and the $N^+$-type diffusion source 42 is taken as "d", a plurality of PMOS structures are prepared in which the distances "d" are different from each other.

These PMOS structures are subjected to anneal treatment in the following four conditions:

(1) only RTA in a condition of 1000° C.×10 seconds
(2) the RTA in the condition of 1000° C.×10 seconds, followed by high temperature/long-time anneal in a condition of 800° C.×30 minutes
(3) the RTA in the condition of 1000° C.×10 seconds, followed by high temperature/long-time anneal in a condition of 850° C.×30 minutes
(4) the RTA in the condition of 1000° C.×10 seconds, followed by high temperature/long-time anneal in a condition of 900° C.×30 minutes The PMOS structures thus annealed are examined in terms of variations in threshold voltage (Vth) due to mutual diffusion between the $P^+$-type diffusion layer 41 and the $N^+$-type diffusion source 42. The results are shown in FIG. 7. In FIG. 8, the abscissa indicates the distance "d" between the $P^+$-type diffusion layer 41 and the $N^+$-type diffusion source 42.

Figure 7:
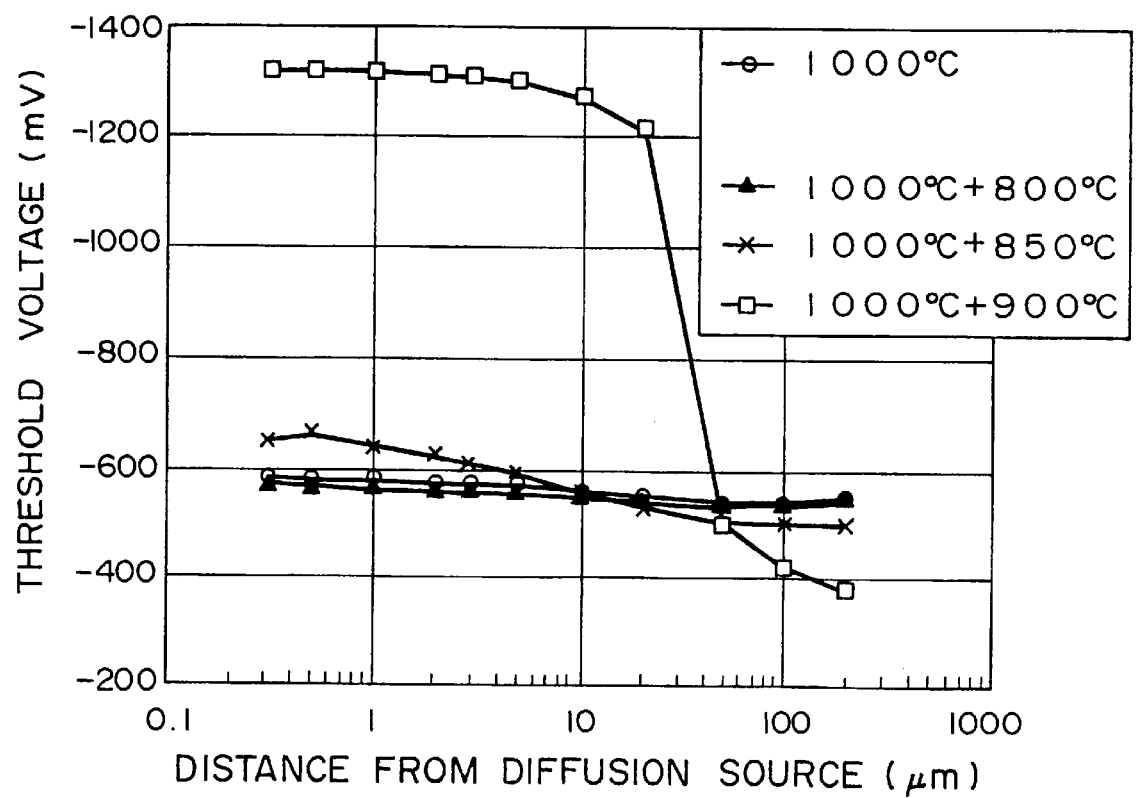
FIG. 7 is a graph showing variations in threshold voltage (Vth) for the PMOS structure shown in FIG. 6 in a state after being subjected to anneal.
Figure 8:
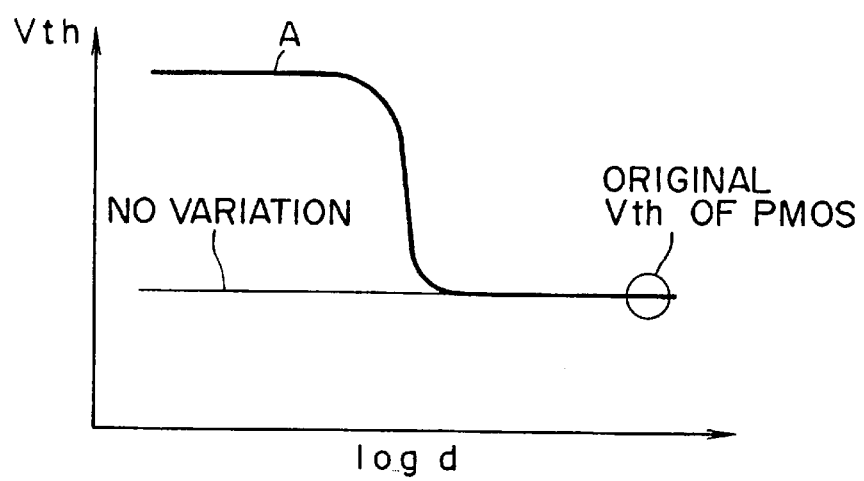
FIG. 8 is a graph showing variations in threshold voltage (Vth) due to mutual diffusion.

As seen from FIG. 7, it is confirmed that variations in vth are increased when the post-anneal (high temperature/long-time anneal) at 850° C. or more is performed after the RTA. Namely, in the case where the $N^+$-type diffusion source 42 is located far away from the $P^+$-type diffusion layer 41 or the $N^+$-type diffusion source 42 is not present, the original Vth of the PMOS can be obtained as shown in FIG. 8; however, in the case where the $N^+$-type diffusion source 42 is located at such a position as to exert an effect on the $P^+$-type diffusion layer 41, the Vth is generally varied (the absolute value of the Vth is increased) as shown by character A in FIG. 8. Accordingly, as shown in FIG. 7, in the case where the anneal treatment is performed in accordance with the above-described condition (3) or (4), the Vth is varied (the absolute value of the Vth is increased) due to diffusion of the impurity from the $N^+$-type diffusion source 42.

A fourth embodiment of the present invention will be described with reference to FIG. 9.

The same MOS structures as those shown in FIG. 6 are prepared and subjected to anneal treatment in the following conditions. In addition, an N$^+$-type diffusion source 42 is formed by ion implantation of P+(phosphorus) in a condition of (energy: 10 keV, dose: 3×10$^{15}$/cm$^2$), and a P$^+$-type diffusion layer 41 is formed by ion implantation of B$^+$ in a condition (energy: 5 keV, dose: 4×10$^{15}$/cm$^2$).

(5) only RTA in a condition of 1000° C.×10 seconds (6) the RTA in the condition of 1000° C.×10 seconds, followed by high temperature/long-time anneal in a condition of 800° C.×30 minutes (7) the RTA in the condition of 1000° C.×10 seconds, followed by high temperature/long-time anneal in a condition of 800° C.×30 minutes and then RTA in a condition of 950° C.×10 seconds The PMOS structures thus annealed are examined in terms of variations in threshold voltage (Vth) due to mutual diffusion between the P$^+$-type diffusion layer 41 and the N$^+$-type diffusion source 42. The results are shown in FIG. 9.

Figure 9:
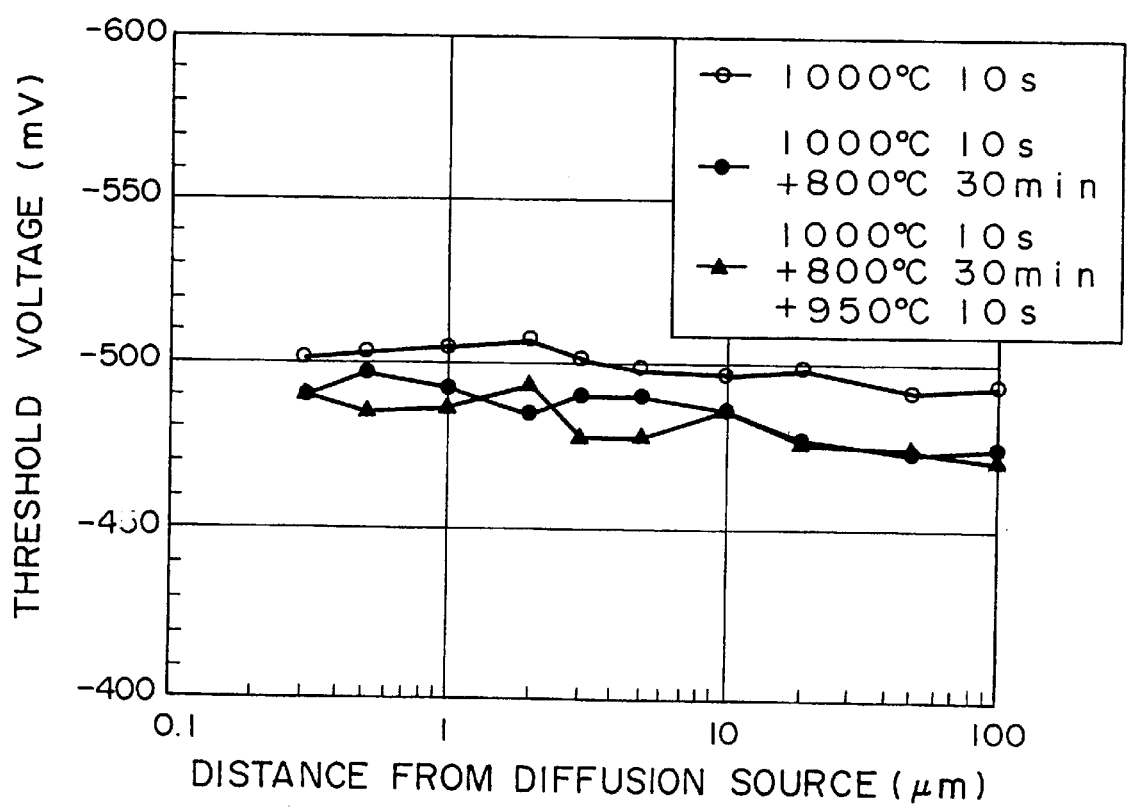
FIG. 9 is a graph showing variations in threshold voltage (Vth) due to mutual diffusion of impurities between a $P^+$-type diffusion layer and an $N^+$-type diffusion layer for a PMOS structure as a fourth embodiment in a state after being subjected to anneal.

As seen from FIG. 9, not only in the case where only the RTA is performed as shown in the condition (5) but also in the case where the final RTA is performed after the high temperature/long-time anneal as shown in the condition (7), the Vth is little varied (the absolute value of the Vth is little decreased).

In the related art fabricating method, as described above, the sheet resistance is increased and the gate electrode is depleted when the final high temperature/long-ime anneal is performed at a temperature of 800 to 850° C. and further the Vth is varied due to mutual diffusion of impurities when the final high temperature/long-time anneal is performed at 850° C.or more; however, according to the fabricating method of this embodiment, it is possible to suppress an increase in sheet resistance and improve depletion of the gate electrode without occurrence of variations in Vth due to mutual diffusion of impurities.

In addition, the reason why the sheet resistance and the degree of depletion are maximized by a long-time anneal at a temperature of from 800 to 850° C. is that the impurities activated by the RTA (1000° C.33 10 seconds) are supersaturated by the heat treatment at about 800° C., that is, atoms of the impurities out of lattice points are increased, and thereby the impurities are inactivated. In other words, for the anneal at a temperature lower than 800° C., the impurities are not moved (not diffused); while for the anneal at a temperature higher than 850° C. the impurities are activated effectively because of the high impurity solubility.

While the preferred embodiments of the present invention have been described using specific terms, such description is for illustrative purposes only, and it is to be understood that changes and variations may be made without departing from the spirit or scope of the following claims.

What is claimed is:

1. A method of fabricating a semiconductor device having an N$^+$-type source/drain layer or P$^+$-type source/drain layer containing an impurity in a concentration of 1×10$^{19}$/cm$^3$ or more, comprising the steps of:

forming an N$^+$-type source/drain layer or P$^+$-type source/drain layer containing an impurity in a concentration of 1×10$^{19}$/cm$^3$ or more; and subjecting said N$^+$-type source/drain layer or P$^+$-type source/drain layer to heat treatments, each of said heat treatments exerting an effect to an active state of said impurity;

wherein said heat treatments each exerting an effect on the active state of said impurity, include a first rapid thermal anneal performed after formation of said N$^+$-type layer or P$^+$-type layer, a high temperature/long-time anneal performed at a temperature of from 600 to 950° C. for a time of at least 10 minutes after said first rapid thermal anneal, and a final rapid thermal anneal.

2. A method of fabricating a semiconductor device according to claim 1, wherein said heat treatments each exerting an effect on the active state of said impurity, are performed at temperatures of 700° C. or more.

3. A method of fabricating a semiconductor device according to claim 1, wherein said rapid thermal anneal is performed at a temperature of from 800 to 1100° C. for a time of 60 seconds or less.

4. A method of fabricating a semiconductor device having a silicon based gate electrode structure containing an impurity, comprising the steps of:

forming a silicon based gate electrode containing a first impurity;

forming N$^+$-type source/drain layer or P$^+$-type source/drain layer containing a second impurity in a concentration of 1×10$^{19}$/cm$^3$ or more; and subjecting said semiconductor device to heat treatments, each of said heat treatments exerting an effect to an active state of said impurities;

wherein said heat treatments include a first rapid thermal anneal performed after formation of said N$^+$-type layer or P$^+$-type layer, a high temperature/long-time anneal performed at a temperature of from 600 to 950° C. for a time of at least 10 minutes after said first rapid thermal anneal, and a final rapid thermal anneal.

5. A method of fabricating a semiconductor device according to claim 4, wherein said rapid thermal anneal is performed at a temperature of from 800 to 1100° C. for a time of 60 seconds or less.

6. A method of fabricating a semiconductor device according to claim 4, wherein said silicon based gate electrode structure is doped with said impurity by ion implantation.

7. A method of fabricating a semiconductor device according to claim 4, wherein said semiconductor device having said silicon based gate electrode structure containing said impurity includes an NMOS field effect transistor having an N$^+$-type gate electrode and a PMOS field effect transistor having a P$^+$-type gate electrode.

8. A method of fabricating a semiconductor device having an N$^+$-type layer or P$^+$-type layer containing an impurity in a concentration of 1×10$^{19}$/cm$^3$ or more; and subjecting said N$^+$-type layer or P$^+$-type layer to heat treatments, each of said heat treatments exerting an effect to an active state of said impurity;

wherein said heat treatments include a first rapid thermal anneal performed after formation of said N$^+$-type layer or P$^+$-type layer, a high temperature/long-time anneal performed at a temperature of from 600 to 950° C. for a time of at least 10 minutes after said first rapid thermal anneal, and a final rapid thermal anneal.

9. A method of fabricating a semiconductor device according to claim 8, wherein said heat treatments each exerting an effect on the active state of said impurity, are performed at temperatures of 700° C. or more.

10. A method of fabricating a semiconductor device according to claim 8, wherein said final rapid thermal anneal is performed at a temperature of from 800 to 1100° C. for a time of 60 seconds or less.

11. A method of fabricating a semiconductor device having a silicon based gate electrode structure containing an impurity, comprising the steps of:

forming a silicon based gate electrode containing an impurity; and subjecting said silicon based gate electrode to heat treatments, each of said heat treatments exerting an effect to an active state of said impurity;

wherein said heat treatments each exerting an effect on the active state of said impurity, include a first rapid thermal anneal performed after formation of said silicon based gate electrode, a high temperature/long-time anneal performed at a temperature of from 600 to 950° C. for a time of at least 10 minutes after said first rapid thermal anneal, and a final rapid thermal anneal.

12. A method of fabricating a semiconductor device according to claim 11, wherein said final rapid thermal anneal is performed at a temperature of from 800 to 1100° C. for a time of 60 seconds or less.

13. A method of fabricating a semiconductor device according to claim 11, wherein said silicon based gate electrode structure is doped with said impurity by ion implantation.

14. A method of fabricating a semiconductor device according to claim 11, wherein said semiconductor device having said silicon based gate electrode structure containing said impurity includes an NMOS field effect transistor having an $N^+$-type gate electrode and a PMOS field effect transistor having a $P^+$-type gate electrode.

* * * * *